Figure 1:
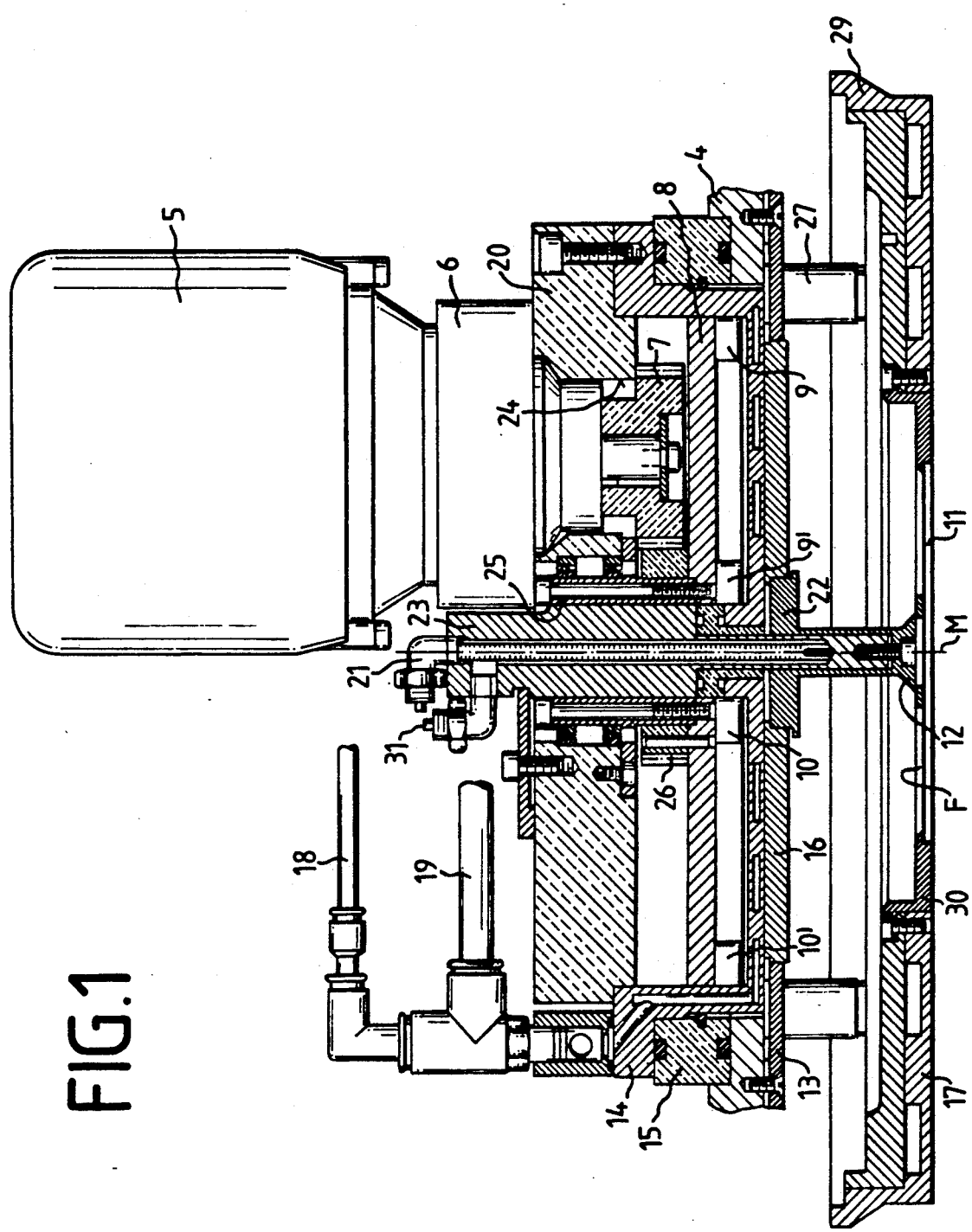

United States Patent [19]

Braeuer et al.

[11] Patent Number: 5,164,063

[45] Date of Patent: Nov. 17, 1992

[54] SPUTTERING CATHODE ARRANGEMENT ACCORDING TO THE MAGNETRON PRINCIPLE FOR COATING A FLAT ANNULAR SURFACE

[75] Inventors: Guenter Braeuer, Freigericht; Eberhard Schultheiss, Herborn, both of Fed. Rep. of Germany

[73] Assignee: Leybold Aktiengesellschaft, Hanau, Fed. Rep. of Germany

[21] Appl. No.: 781,763

[22] Filed: Oct. 23, 1991

[30] Foreign Application Priority Data

Aug. 27, 1991 [DE] Fed. Rep. of Germany ....... 4128340

[51] Int. Cl.$^5$ .............................................. C23C 14/34
[52] U.S. Cl. .......................... 204/298.2; 204/192.12; 204/298.19; 204/298.11
[58] Field of Search ...................... 204/192.12, 298.11, 204/298.15, 298.19, 298.20

[56] References Cited

U.S. PATENT DOCUMENTS

| 4,498,969 | 2/1985 | Ramachandran | 204/298.2 X |
| 4,745,878 | 5/1988 | Sagawa | 204/298.11 X |
| 4,746,417 | 5/1988 | Ferenbach et al. | 204/298.2 |
| 4,869,801 | 9/1989 | Helm et al. | 204/298.15 |
| 4,872,964 | 10/1989 | Suzuki et al. | 204/298.2 |

FOREIGN PATENT DOCUMENTS

| 0211412 | 2/1987 | European Pat. Off. . |
| 0248244 | 12/1987 | European Pat. Off. . |
| 0365249 | 4/1990 | European Pat. Off. . |
| 0439360 | 7/1991 | European Pat. Off. . |
| 0439361 | 7/1991 | European Pat. Off. . |
| 2707144 | 8/1977 | Fed. Rep. of Germany . |
| 3619194 | 12/1987 | Fed. Rep. of Germany . |

OTHER PUBLICATIONS

Patent Abstracts of Japan: 02-254162 A, C-792, Dec. 26, 1990, vol. 14, No. 582.
Patent Abstracts of Japan: 01-309965 A, C-694, Feb. 27, 1990, vol. 14, No. 106.
Patent Abstracts of Japan: 01-177370 A, C-644, Oct. 16, 1989, vol. 13, No. 457.
Patent Abstracts of Japan: 63-282263 A, C-576, Mar. 14, 1989, vol. 13, No. 107.
Patent Abstracts of Japan: 63-247366 A, C-566, Feb. 8, 1988, vol. 13, No. 056.
Patent Abstracts of Japan: 63-149374 A, C-540, Oct. 28, 1988, vol. 12, No. 410.
Patent Abstracts of Japan: 62-211375 A, C-480, Mar. 9, 1988, vol. 12, No. 075.

Primary Examiner—Nam X. Nguyen
Attorney, Agent, or Firm—Felfe & Lynch

[57] ABSTRACT

In a sputtering cathode arrangement according to the magnetron principle for the coating of a flat circular substrate, with a circular ring-shaped target and an outer mask and inner mask disposed between the target and the substrate, a magnet system with a yoke plate being disposed in back of the target for the production of the magnetron effect, the inner mask is fastened to a mask holder which is brought through the center of the target, the magnet system with the yoke plate (8) being disposed for rotation about an axis of rotation (M) going through the center of the target, and consisting of at least two magnet arrangements (9,9', ... ; 10,10', ... ) off-center from the axis of rotation, each of which produces a self-contained tunnel of magnetic lines of force, each tunnel lying outside of the axis of rotation (M), and the eccentric dispositions of the two magnet arrangements with respect to the axis of rotation (M) being so chosen that the sum of the rate contributions of all target portions within magnetic lines of force from magnetrons and deposited on the substrate is very uniform across the radius within the circular coating surface.

4 Claims, 4 Drawing Sheets

SPUTTERING CATHODE ARRANGEMENT ACCORDING TO THE MAGNETRON PRINCIPLE FOR COATING A FLAT ANNULAR SURFACE

The invention relates to a sputtering cathode arrangement according to the magnetron principal for coating a ring-shaped coating surface of a circular disk-shaped substrate, having a ring-shaped target and an outer mask and inner mask disposed between the target and the substrate, each with a circular margin for covering the substrate surfaces lying outside and inside of the coating surface concentric with the substrate, wherein a magnet system with a yoke plate for producing the magnetron effect is disposed in back of the target.

Magnetron sputtering cathodes are distinguished by a sputtering rate that is greater by a factor of 10 to 30 than sputtering systems unassisted by a magnetic field. This advantage is obtained, however, with the disadvantage of an extremely irregular sputtering of the target plate, because the constriction of the plasma that is forced by the magnetic tunnel in magnetrons expresses itself in a corresponding spatial restriction of the sputtering effect. By the formation of a deep erosion pit, whose deepest point is situated under the culmination points of the magnetic lines of force, the sputtering process has to be terminated after only 25 to 30% of the target material has been sputtered. In stationary coating systems, i.e., in those without relative movement between cathode and the substrates, this results in very uneven coating densities. Basically, the erosion pit would be imaged almost photographically on the substrates.

This problem, as well as a series of attempts at solving it, is addressed in DE-OS 27 07 144 and DE-OS 36 19 194. These attempts include especially a magnetron sputtering cathode in which a single, self-contained magnet system rotates in an eccentric position behind a circular target plate (FIGS. 22 to 25 of DE-OS 27 07 144), the magnets forming two self-contained strings of magnets one inside the other.

In the case of a rotating sputtering cathode with a circular disk-shaped target plate, EP 0 365 249 A2 furthermore has disclosed (FIG. 6) arranging a portion of the magnets in a row behind this plate such that the magnets form an asymmetrical ring and providing the other part of the magnets in a kind of island all clustered together in the center of the target plate, the series of magnets forming the ring being all aimed with their south pole, and the magnets assembled into an island being all aimed with their north pole, at the target plate.

Finally, a stationary magnetron sputtering cathode for vacuum coating apparatus for substrates moving on a circular path in front of the cathode and disposed on a rotating substrate holder has been proposed (P 40 39 101.9); it is equipped with a target plate and a support plate or yoke plate disposed in a plane parallel with the target plate, and has a magnet system provided in back of the target plate, formed of a plurality of permanent magnets, a first group or series of magnets having each the same polarity and a second group or series of magnets having an opposite polarity, such that over the target plate a self-contained tunnel of magnetic lines of force is formed, issuing from the first group or series and returning to the second group or series, the yoke plate being of a circular disk shape, and the first group or series of magnets, forming essentially a closed circular ring, being provided in the marginal area of the yoke plate, and the second group or series of magnets, forming a random but substantially symmetrical configuration, being provided in the central area of the yoke plate, the section of the magnetic tunnel running in the area of the half of the yoke plate that faces away from the axis of rotation of the substrate holder having an overall greater length than the tunnel section that is provided on the half of the yoke plate that faces the axis of rotation.

Now, the present invention is addressed to the problem of creating a sputtering cathode arrangement which is suitable for the production of magneto-optical data storage. The round cathode is to be suitable for the sputtering of coatings with a uniformity of coating thickness of better than ±2%, both for reactive sputtering processes (e.g., $Si_3N_4$) and for metallic sputtering (e.g., Fe, Tb, Co, Al).

This problem is solved in accordance with the invention in that a) the inner mask is fastened to a mask holder which is brought through the center of the target, b) the magnet system with the yoke plate is made rotatable about an axis passing through the center of the target, and consists of at least two magnet arrangements each forming a magnetron and being off-center from the said axis of rotation, each producing a self-contained tunnel of magnetic lines of force issuing from the target and, after tracing arcuate paths, returning into the target, and each tunnel being situated outside of the axis of rotation, and in that c) the eccentric dispositions of the at least two magnet arrangements with respect to the axis of rotation are selected such that the sum of the rate contributions from all magnetrons, precipitated on the substrate, is very uniform across the radius within the circular coating surface.

Figure 2:
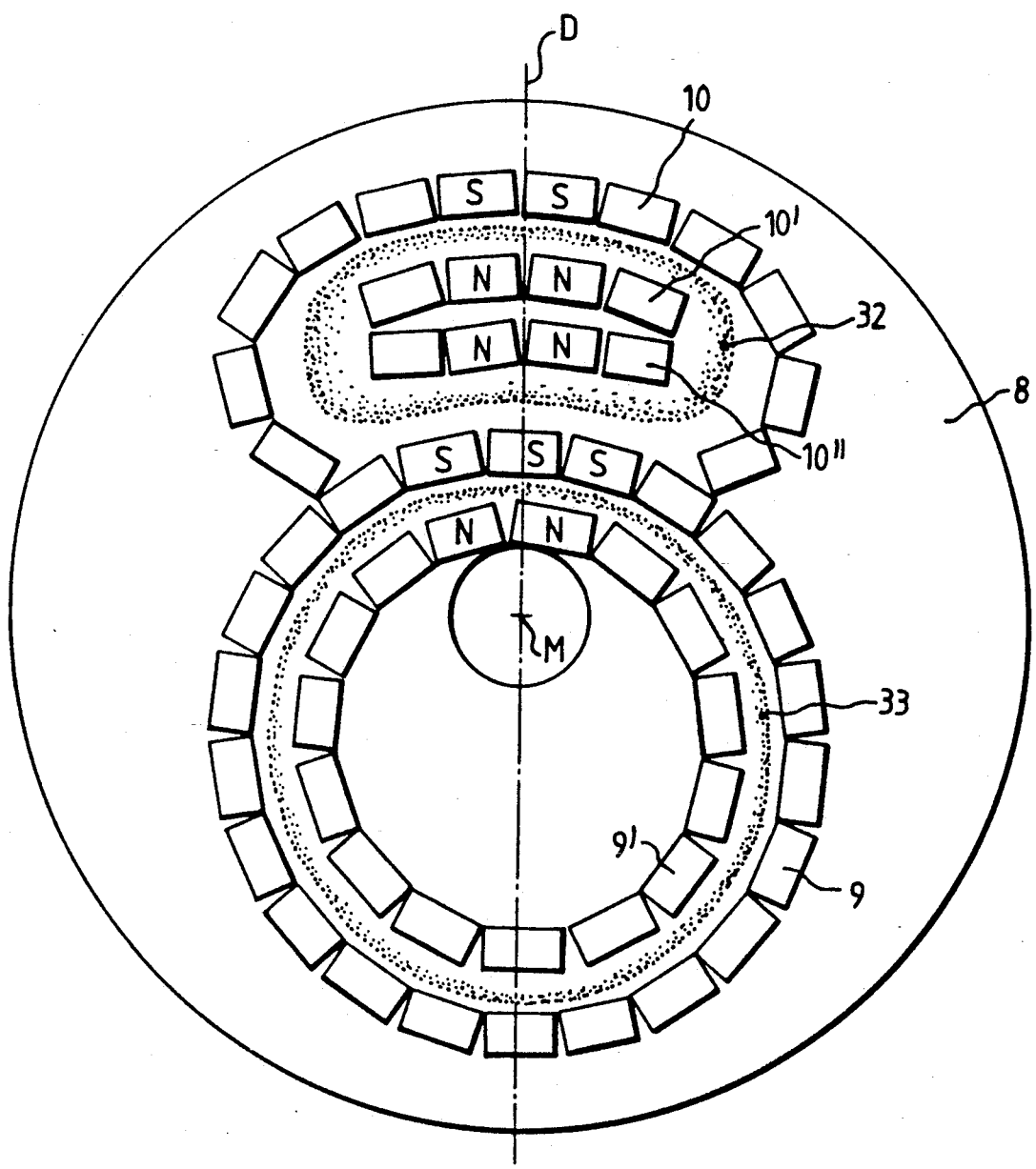
Figure 3:
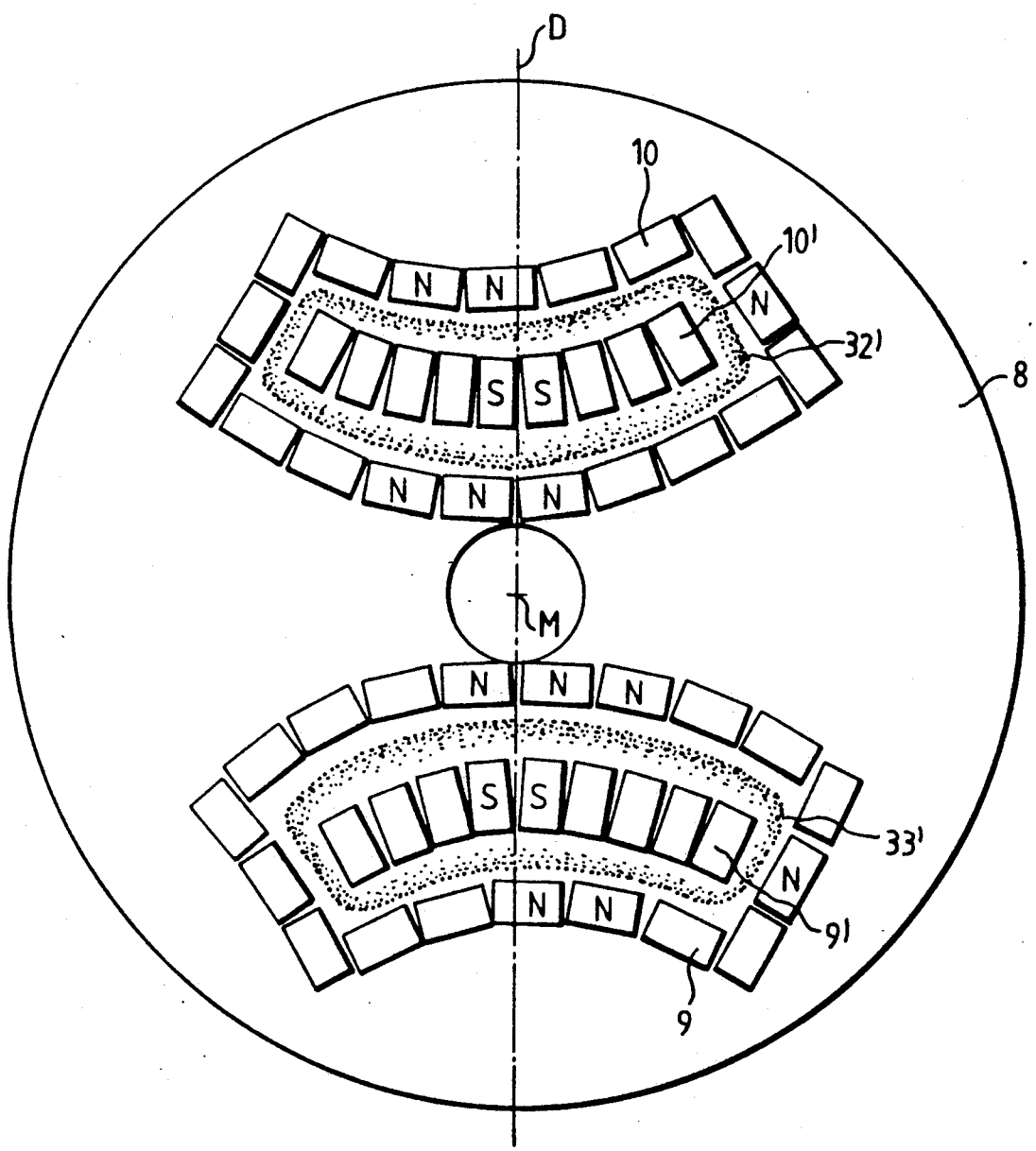
Figure 4:
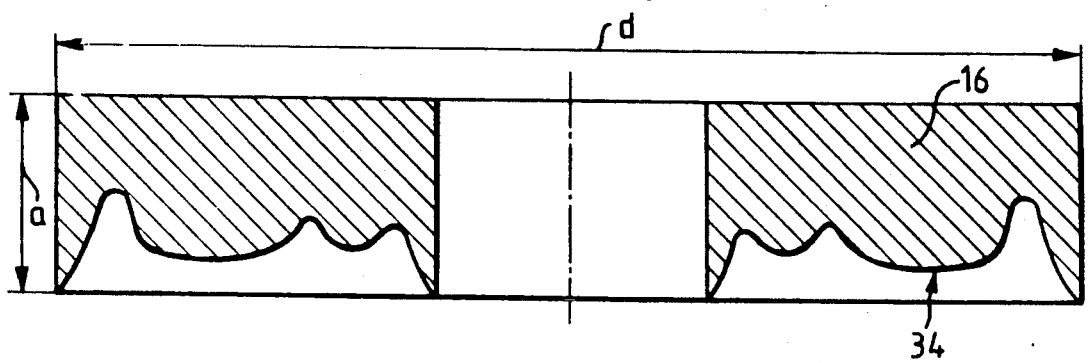
Figure 5:
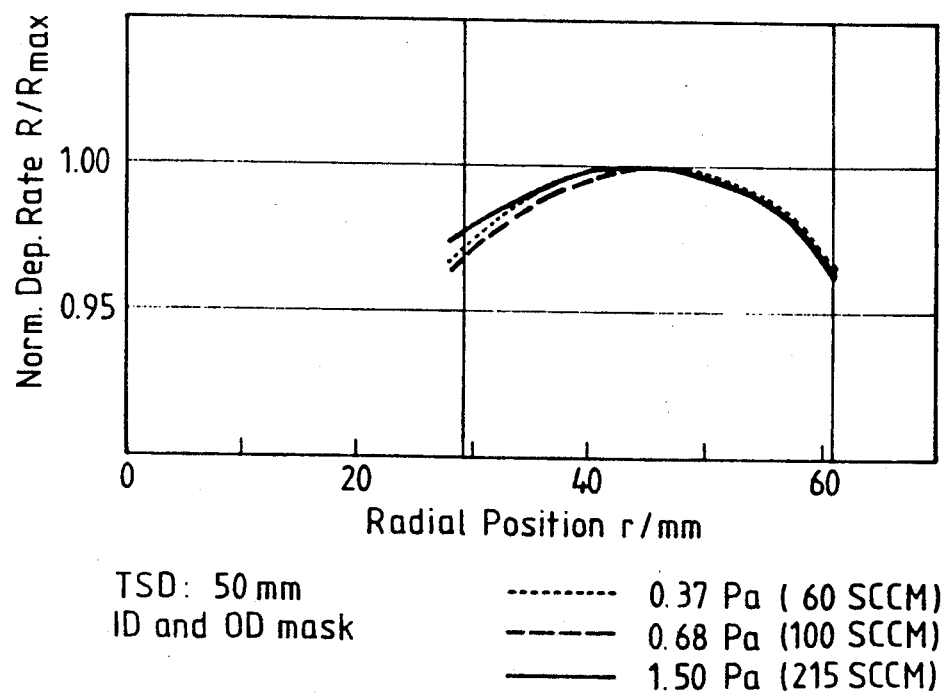

The invention admits of a great variety of embodiments; two of them are represented diagrammatically in the appended drawings, wherein:

FIG. 1 is a longitudinal section through the sputtering cathode, with a motor for driving the magnet arrangement with the mask system and the holder for the substrate, FIG. 2 is a top view of a yoke plate with a set of magnets according to the invention, FIG. 3 is a top view of a yoke plate with an alternative set of magnets, FIG. 4 is a section taken transversely through the target showing an erosion pit or erosion profile such as results from the use of a magnet set according to FIG. 3 (the thickness "a" being drawn in a different scale than the diameter "d"), and FIG. 5 is a diagrammatic representation of the thickness distribution of the sputtered coating ($SiN_x$) at different process gas pressures (at three different pressures), namely for a magneto-optical data storage of 5.25" diameter and a data storage area width r=29−61 mm, the greatest rate being taken as 1.00.

The sputtering cathode arrangement according to FIG. 1 consists essentially of the target holding pot 14 affixed to the cathode holding frame 4 with the interposition of ahn insulating ring 15, a cathode back plate 20, the transmission 6 of a motor 5 with drive pinion 7 mounted in a recess 24, a vertically disposed cooling tube 23 held in a central bore in the cathode back plate 20 by bearing sleeve 25, and with a yoke plate 8 with drive pinion 26 screwed to the bearing sleeve 25, and with magnets or sets of magnets 9, 9', . . . ; 10, 10', 10", ..., fixedly disposed on the yoke plate 8, the circular target 16 fastened on the target holding pot, the dark-space shield 13 screwed to the cathode holding frame 4, the inner mask 12 connected to the cooling tube 23, and the mask holder 29 with outer mask 17 and mask collar 30, which is held by the studs 27 and 28 of the dark-space shield 13.

As it can easily be seen in FIG. 1, some parts of the cathode arrangement contain cooling bores and cooling lines, for which cooling water inlet and outlet connections 18, 19, 21, 31 are provided.

As FIG. 2 shows, in a preferred embodiment (magnet arrangement for $Si_3N_4$) two groups of magnets 9, 9' and 10, 10', 10'', respectively, are mounted on the rotating yoke plate, the one group of magnets together forming two concentric circles both disposed outside of the axis of rotation M, and the second set of magnets consisting of a row of magnets 10 which together form a not quite closed oval with both ends in contact with the periphery of the outer ring of the group formed by the magnets 9, two additional rows of magnets 10' and 10'' being provided, which are together surrounded by the oval and are arranged parallel to one another. The polarity of all sets of magnets is selected such that the two magnet groups form two plasma rings 32, 33, under process conditions.

In the case of the embodiment for a magnet arrangement according to FIG. 3 (magnet arrangement for Fe, Tb or Co), both groups of magnets 9, 9' and 10, 10' are configured somewhat similarly and grouped on the rotating yoke plate 8, a close row of magnets 9 and 10 being provided in each case, each configured approximately rectangularly or circularly, each of these two configurations surrounding an approximately straight or slightly curved row of magnets 9' and 10', respectively, inside of each configuration, so that again two plasma rings 32 and 33 are formed under process conditions.

FIG. 4 shows a section through the target 16, as it typically forms after a long time of operation. Under the influence of two off-center magnet arrays provided on the rotating yoke 8, each of which produces a self-contained tunnel of magnetic lines of force issuing from the target 16 shown in section and after tracing arcuate paths returning into the target 16, an erosion profile is formed which by and large shows a uniform ablation of the target. The erosion profile 34 is the result of the use of a magnet arrangement as represented in FIG. 2.

FIG. 5 shows that, in the case of three different gas pressures (argon), the required ±2% difference in coating thickness is maintained in the area of the usable circular zone of a substrate of 5.25" diameter (r=29 mm to 61 mm). (1.00 is taken as the greatest deposition in the diagram).

We claim:

1. Sputtering cathode arrangement according to the magnetron principle for the coating of a circular coating surface of a circular disk-shaped substrate (11), with a circular-shaped target (16) and an outer mask (17) and inner mask (12) disposed between the target (16) and the substrate (11), each with a circular margin for shielding the substrate surfaces lying outside and inside of the coating area concentric with the substrate (11), a magnet system (9, 9', ..., 10, 10', ...) with a yoke plate (8) being disposed in back of the target (16) for the production of the magnetron effect, characterized in that
   a) the inner mask (12) is fastened to a mask holder (22) which is brought through the center (M) of the target (16),
   b) the magnet system (9, 9', ...; 10, 10',10'', ...) is disposed for rotation about an axis (M) passing through the center of the target, and comprises at least two magnet arrangements (9, 9', ...; 10, 10', ...) off-center from the said axis of rotation (M), each forming a magnetron, each of which produces a self-contained tunnel of magnetic lines of force issuing from the target (16) and after tracing arcuate paths reentering the target (16), each tunnel lying outside of the axis of rotation (M), and
   c) eccentric dispositions of the at least two magnet arrangements (9, 9', ...; 10, 10', 10'', ...) with respect to the axis of rotation (M) are so chosen that the sum of the rate contributions of target portions within magnetic lines of force from all magnetrons and precipitated on the substrate (11) is very uniform across the radius within the circular coating surface (F).

2. Sputtering cathode arrangement according to claim 1, characterized in that each of the two magnet arrangements has at least two rows of magnets (9, 9' and 10, 10', 10''), of which at least one row of magnets (9 and 10, respectively) forms a closed circular ring, and a second row of magnets forms a closed ring.

3. Sputtering cathode arrangement according to claim 1, characterized in that the polarity of a first series of magnets is opposite the polarity of another series of magnets surrounded by the first series.

4. Sputtering cathode arrangement according to claim 1, characterized by at least two magnet arrangements disposed on the rotatable yoke plate (8), each of which comprises two groups (9, 9', and 10, 10', 10'') of individual magnets, the individual magnets of a first group (9) together forming a ring-shaped configuration and the individual magnets of a second group (9') together forming a second ring-shaped configuration surrounded by the first group, a closed magnetic tunnel (33) forming between the first and the second groups (9) of magnets, since the polarity of the individual magnets of the first group is the opposite of that of the second group, and the centers of the areas of the configurations formed in each case by the magnet arrangements is off-center, but on a straight line (D) running perpendicular to the axis of rotation (M) of the yoke plate.

* * * * *

UNITED STATES PATENT AND TRADEMARK OFFICE
CERTIFICATE OF CORRECTION

PATENT NO. : 5,164,063
DATED : November 17, 1992
INVENTOR(S) : Guenter Brauer et al It is certified that error appears in the above-indentified patent and that said Letters Patent is hereby corrected as shown below:

Column 2, line 62, "ahn" should read --an--.

Signed and Sealed this

Sixth Day of December, 1994

Attest:

BRUCE LEHMAN

Attesting Officer

Commissioner of Patents and Trademarks